United States Patent
Tunaboylu et al.

(10) Patent No.: US 7,583,098 B2
(45) Date of Patent: Sep. 1, 2009

(54) AUTOMATED PROBE CARD PLANARIZATION AND ALIGNMENT METHODS AND TOOLS

(75) Inventors: Bahadir Tunaboylu, Chandler, AZ (US); Guy B. Frick, Maple Glen, PA (US); Edward L. Malantonio, Conshohocken, PA (US); Horst Clauberg, Warminster, PA (US); John McGlory, Chandler, AZ (US)

(73) Assignee: SV Probe Pte. Ltd., Singapore (SG)

( * ) Notice: Subject to any disclaimer, the term of this patent is extended or adjusted under 35 U.S.C. 154(b) by 59 days.

(21) Appl. No.: 11/703,891

(22) Filed: Feb. 7, 2007

(65) Prior Publication Data

US 2007/0216431 A1    Sep. 20, 2007

Related U.S. Application Data

(60) Provisional application No. 60/771,566, filed on Feb. 8, 2006.

(51) Int. Cl.
*G01R 31/02* (2006.01)
(52) U.S. Cl. .......................... 324/758; 324/756
(58) Field of Classification Search ............... 324/757, 324/758, 158.1; 356/3; 33/1 M; 73/105
See application file for complete search history.

(56) References Cited

U.S. PATENT DOCUMENTS

| 4,055,805 | A | * | 10/1977 | Ardezzone | ............... | 324/756 |
| 4,892,122 | A |   | 1/1990  | Ickes      |                |         |
| 5,065,092 | A | * | 11/1991 | Sigler     | ............... | 324/758 |
| 5,394,100 | A | * | 2/1995  | Bohler et al. | ............ | 324/758 |
| 5,410,259 | A | * | 4/1995  | Fujihara et al. | .......... | 324/758 |
| 5,642,056 | A | * | 6/1997  | Nakajima et al. | .......... | 324/758 |
| 5,861,759 | A | * | 1/1999  | Bialobrodski et al. | ...... | 324/758 |

(Continued)

OTHER PUBLICATIONS

European Patent Office, "Notification of Transmittal of the International Search Report and the Written Opinion of the International Searching Authority, or the Declaration", International application No. PCT/US2007/003474, dated Oct. 8, 2007, 15 pages.

(Continued)

*Primary Examiner*—Ha Tran T Nguyen
*Assistant Examiner*—Arleen M Vazquez
(74) *Attorney, Agent, or Firm*—Hickman Palermo Truong & Becker LLP; Edward A. Becker

(57) ABSTRACT

A method and apparatus for performing automated alignment of probes of a probe card is provided. The desired horizontal location for a probe is compared with the actual horizontal position for the probe to determine a horizontal correction distance and a horizontal correction direction to correct a horizontal alignment for the probe. A first tool automatically corrects the horizontal alignment for the probe based on the horizontal correction distance and the horizontal correction direction. Upon determining that an actual vertical position of the probe is closer to the probe card than a desired vertical position, a second tool automatically changes the actual vertical position of the probe to the desired vertical position. Upon determining that the actual vertical position of the probe is farther from the probe card than the desired vertical position, a third tool automatically changes the actual vertical position of the probe to the desired vertical position.

11 Claims, 7 Drawing Sheets

U.S. PATENT DOCUMENTS

| | | | |
|---|---|---|---|
| 6,674,296 B1 * | 1/2004 | Duckworth et al. | 324/758 |
| 6,727,579 B1 | 4/2004 | Eldridge et al. | |
| 7,022,976 B1 * | 4/2006 | Santana et al. | 250/234 |
| 7,119,566 B2 * | 10/2006 | Kim | 324/758 |
| 2003/0006755 A1 | 1/2003 | Taylor | |
| 2004/0032272 A1 | 2/2004 | Maruyama et al. | |

OTHER PUBLICATIONS

Claims, International application No. PCT/US2007/003474, 6 pages.

* cited by examiner

AUTOMATED PROBE CARD PLANARIZATION AND ALIGNMENT METHODS AND TOOLS

RELATED APPLICATION DATA

This application claims the benefit of, and priority to, U.S. Provisional Patent Application No. 60/771,566, entitled Automated Probe Card Planarization And Alignment Methods And Tools, filed on Feb. 8, 2006, the contents of which are incorporated by reference for all purposes as if fully set forth herein.

FIELD OF THE INVENTION

The present invention relates to performing planarization and alignment of probes of a probe card.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

When testing a device under test (DUT), such as semiconductor wafers having non-singulated devices thereon, for example, one or more probe cards having an array or pattern of probes that match or mirror the die pads (for example) of the DUT, may be positioned between: (1) the DUT; and (2) a tester to achieve electrical connection there between. In the case of a probe card having cantilever probes, for example, the lower surface of an elongated beam may be bonded to a post at one end of the beam and a probe tip is formed on the upper surface on the other end of the beam to cantilever the beam/probe. The probe tips are designed to make physical and electrical contact with the DUT die pads/contacts.

The planarity and/or co-planarity of the probes and/or probe tips on the probe cards is important to ensure electrical contact of the probe tips to all of the corresponding DUT die pads to be tested, preferably simultaneously, to not only minimize or eliminate false negatives during testing, but to prolong the life of the probes and probe cards. For example, if one or more probe tips extend too far above the probe surface (too-high in the Z-direction, for example), then the probe card may be positioned to ensure contact with the remainder of the probe tips, eventually overstressing these too-high probe tips probes that may lead to premature malfunctioning, damage or even breakage of the probes.

If one or more of the probes/probe tips on the probe cards extends too near the supporting substrate surface (too low in the Z-direction) then the probe array may be positioned (e.g., during testing) to ensure contact with the, presumably minority, too-low probe tips, eventually overstressing the correctly vertically aligned probes that may lead to premature malfunctioning, damage or even breakage of the correctly vertically aligned probes. Further, in the case that some probes/probe tips are too-low and some probes/probe tips are too-high, even greater stress is exerted upon the too-high probes as the probe card is positioned even closer to the DUT to ensure contact between the too-low probe tips and the DUT contacts.

It is also important to ensure that the probes are also horizontally aligned (in the X- or Y-direction, as appropriate), that is, the probes/probe tips are either maintained in substantial parallel alignment with select adjacent probe(s)/groups of probes or at a specified horizontal distance in relation to other probes on the probe cards to ensure contact with the corresponding DUT contacts.

In the normal course of repeated testing of the DUTs many thousands of touchdowns (separate physical contact between the probe tips and the die pads, for example, of the DUTs) may be achieved. This may lead to normal wear and tear on the probes and/or probe tips causing damage or breakage of the probes and/or probe tips and (further) misalignment, either vertically or horizontally, of some or many of the probes and/or probe tips.

BRIEF DESCRIPTION OF THE DRAWINGS

Embodiments of the present invention are illustrated by way of example, and not by way of limitation, in the figures of the accompanying drawings and in which like reference numerals refer to similar elements and in which.

DETAILED DESCRIPTION

Figure 1A:
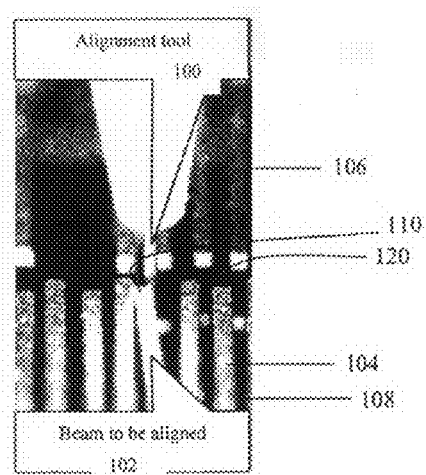
FIGS. 1A-1F illustrate a lateral beam alignment process according to an embodiment of the invention.

In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form in order to avoid unnecessarily obscuring the embodiments of the invention described herein.

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. In the description, relative terms such as "horizontal," "vertical," "up," "down," "top," and "bottom" as well as derivatives thereof (for example, "horizontally," "downwardly," "upwardly," etc.) should be construed to refer to the orientation as then described or as shown in the drawing figure under discussion unless otherwise specifically described. These relative terms are for convenience of description and normally are not intended to require a particular orientation. Terms "inwardly," "outwardly," "longitudinal" versus "lateral" and the like are to be interpreted relative to one another or relative to an axis of elongation, or an axis or center of rotation, as appropriate. Terms such as "connected" and "interconnected" refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship.

In an embodiment, automated alignment of a probe of a probe card in performed in a series of steps. Desired horizontal locations for probes of the probe card for a device under test (DUT) to be tested by the probe card are determined. Actual horizontal positions for the probes of the probe card are also determined. The desired horizontal location for a probe are compared with the actual horizontal position for the probe to determine a horizontal correction distance and a horizontal correction direction to correct a horizontal alignment for the probe. Upon obtaining the horizontal correction distance and the horizontal correction direction for the probe, a first tool automatically corrects the horizontal alignment for the probe based on the horizontal correction distance and the horizontal correction direction. Upon determining that an actual vertical position of the probe is closer to the probe card than a desired vertical position, a second tool automatically changes the actual vertical position of the probe to the desired vertical position. Upon determining that the actual vertical position is farther from the probe card than the desired vertical position, a third tool automatically changes the actual vertical position of the probe to the desired vertical position.

Figure 5:
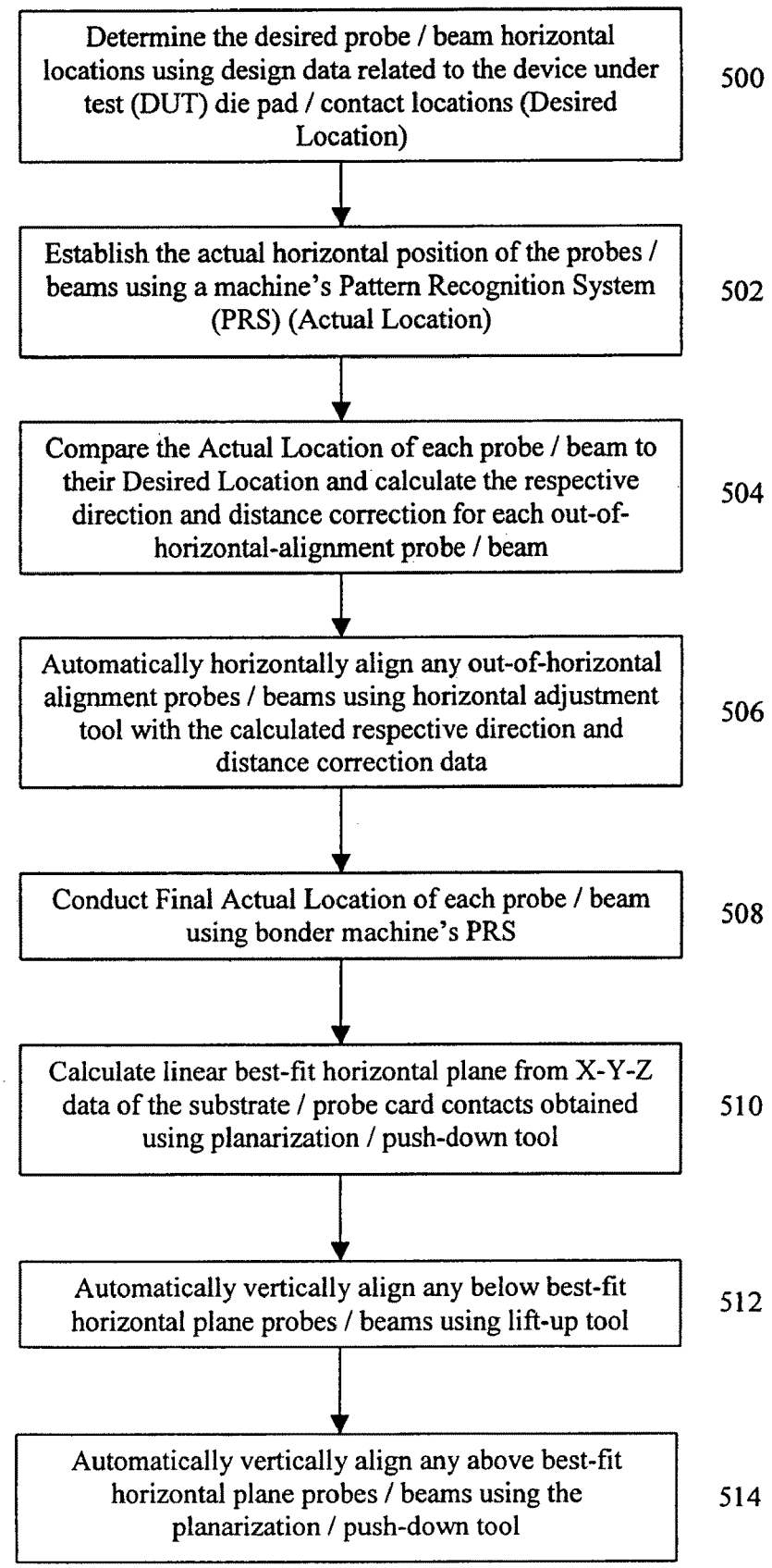
FIG. 5 is a flow chart illustrating an alignment process according to an embodiment of the invention.

As illustrated in the flow chart of FIG. 5, which shows an embodiment of the invention, the lateral adjustment (repair) process of horizontally misaligned probes/probe tips may be conducted first, then the lift-up (repair) process of the too-low probes/probe tips may be conducted and then the push-down (repair) process of the too-high probes/probe tips may be conducted. It is contemplated that these three alignment/repair processes of the present invention may be performed singularly or jointly as desired and may further be performed in any sequence as desired.

Specifically, as illustrated in box 500, the desired probe/beam horizontal locations on a substrate/probe card or the like may be established using, for example, design data related to the device under test (DUT) die pad/contact locations (Desired Location). As illustrated in box 502, the actual horizontal positions of the probes/beams may be established using a machine's (e.g., a wire bonding machine) Pattern Recognition System (PRS) (Actual Position). As illustrated in box 504, the Actual Location of each probe/beam may then be compared to its respective Desired Location and the respective direction and distance correction for each out-of-horizontal alignment probe/beam may be calculated. As illustrated in box 506, any out-of-horizontal alignment probes/beams may be automatically horizontally aligned using a horizontal adjustment tool in accordance with the present invention using the calculated respective direction and distance correction data for such probes/beams. As illustrated in box 508, a final Actual Location of each probe/beam may be established using the machine's PRS. As illustrated in box 510, a linear best-fit horizontal plane may be calculated from X-Y-Z data of the substrate/probe card contacts obtained using a planarization/push-down tool in accordance with the present invention. As illustrated in box 512, any below best-fit horizontal plane probes/beams may be automatically vertically aligned using a lift-up tool in accordance with the present invention. As illustrated in box 514, any above best-fit horizontal plane probes/beams may be automatically vertically aligned using the planarization/push-down tool in accordance with the present invention.

These steps in boxes 500 to 514 of FIG. 5 may be performed sequentially, for example, or in another order as desired for the particular application. Some of steps 500 to 514 may be eliminated and other steps not specifically listed may be included/inserted, again, as desired for the particular application.

The individual steps/boxes 500, 502, 504, 506, 508, 510, 512, 514 of FIG. 5 are described in greater detail herein.

As illustrated in FIGS. 1A-1F which depict a horizontal alignment (repair) process according to an embodiment of the invention, probe beams 102/probe tips 110 that have become horizontally out of alignment on a probe card or the like in relation to adjacent probe beams 104/probe tips or other reference probe beams 106/probe tips may be brought back into horizontal alignment as described below. These process steps may be sequential, for example, and may be performed in an automated, essentially preprogrammed process, for example.

Design data related to the device under test (DUT) die pad/contact locations may be used to generate a reference system which in turn defines the horizontal (Z-direction) desired location of the respective probe tips relative to alignment fiducials (not illustrated) formed on the probe card (Desired Locations). The actual individual probe/beam 102, 104, 106 positions (Actual Locations) may be measured, for example, by (1) finding the probe tip 110 and/or (2) the beam 102, 104, 106 using a wire bonder machine's Pattern Recognition System (PRS).

For each probe/beam 102, 104, 106, its Actual Location is compared against its Desired Location and the appropriate direction and distance correction (including, for example, an elastic component of the distance, overbend) may be computed based upon the beam properties. For example, for beam 102 comprised of a material having a greater elasticity compared to another material, a larger distance correction may be determined to ensure the probe/beam 102 will be in the Desired Location horizontally after the horizontal alignment process is completed. Horizontal adjustment tool 100 may be installed, directly or indirectly, into a machine (e.g., a wire bonder) (not shown) and squared to the machine's X-Y axis to ensure grounding of all beams 102, 104, 106 to the workholder base. Then, as illustrated in FIG. 1A, for example, horizontal adjustment tool 100 may descend in front of out-of-horizontal-alignment beam (misaligned beam) 102, that is generally adjacent/proximate to a group of aligned beams 104, 106 until contact is made with the surface 120 of probe card 108.

Horizontal/lateral adjustment tool 100 may have a narrow cylindrical section with a diameter capable of fitting between adjacent beams yet still having sufficient strength to deflect the out-of-horizontal-beam 102 into its Desired Beam Location. Tool 100 may have a slight taper in order to maintain sufficient strength to laterally bend the misaligned beam 102 in tightly constrained spaces. For example, tool 100 may be comprised of tungsten (W) wire pressed into an alumina capillary or a single piece of machined tungsten carbide. For example, lateral adjustment tool 100 may be comprised of tungsten having a diameter of about 2 mil. Tool 100 may be configured to fit into a standard ball bonder capillary clamp.

Beams 102, 104, 106 may be comprised of, for example, a nickel alloy such as NiMn. Probe card 108 may include a substrate (e.g., an MLO substrate or an MLC substrate such as a space transformer) by which the probes (including beams 102, 104, and 106) are supported.

Figure 1B:
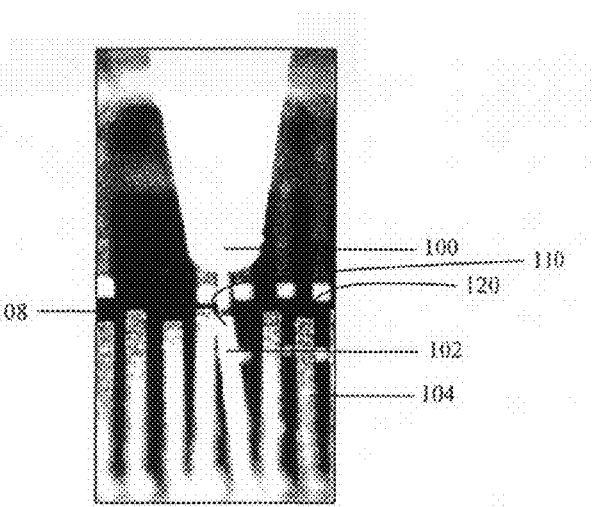

As illustrated in FIG. 1B, for example, tool 100 may move upwardly a predetermined clearance distance sufficient to avoid contact with the surface of probe card 108 and then may move laterally opposite the direction of the intended correction (that is, tool 100 moves to the left in FIG. 1B, for example) to clear tip 110 of misaligned beam/probe 102.

Figure 1C:
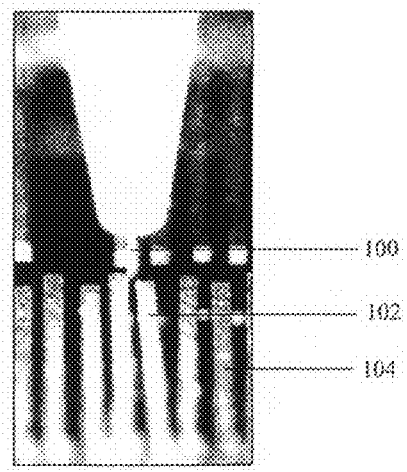
Figure 1D:
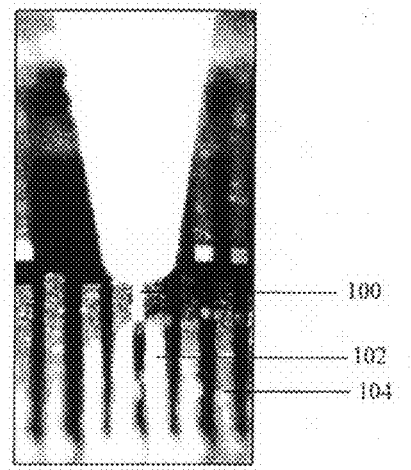

As illustrated in FIGS. 1C and 1D, for example, tool 100 may move along the side of misaligned beam 102 (FIG. 1C) to a programmed position (FIG. 1D). This programmed position is calculated by taking into consideration the properties of misaligned beam 102, such as its composition, and the amount of misaligned beam's 102 misalignment, etc.

Figure 1E:
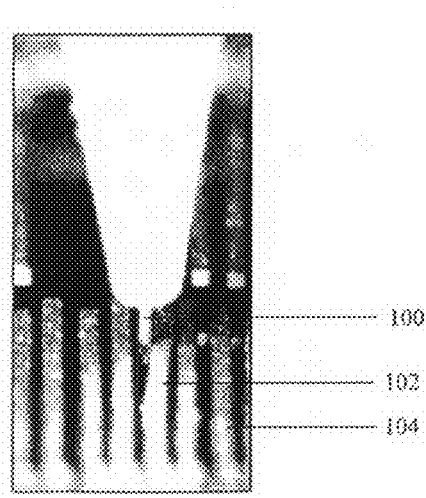
Figure 1F:
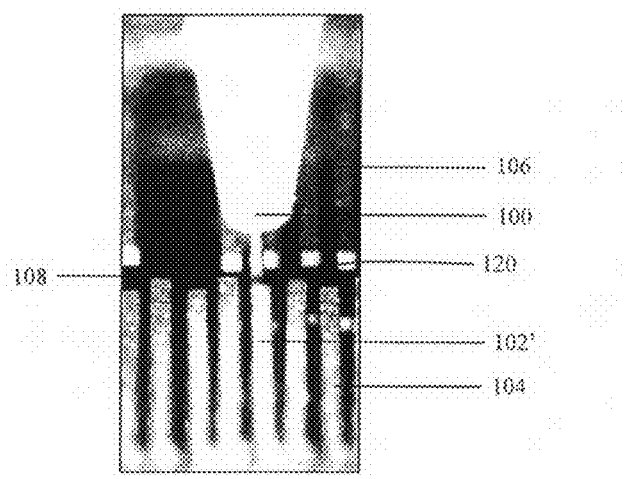

As illustrated in FIGS. 1E-1F, for example, tool 100 moves laterally, that is to the right in FIG. 1E, deflecting misaligned beam 102 the previously calculated distance correction (including, for example, an elastic component of the distance, overbend) so as to bring misaligned beam 102 into alignment once tool 100 is removed (FIG. 1F, for example).

As illustrated in FIG. 1F, for example, horizontal adjustment tool 100 may retract from now aligned beam 102' by using a path reverse to that used to deflect beam 102, for example, to essentially the same position as that in FIG. 1A.

This process may then be repeated for each horizontally misaligned beam as determined by the machine's PRS.

A final beam 102, 104, 106 probe measurement may then be made using the machine's PRS (e.g., the PRS of a wire bonder) to verify the lateral adjustments made to any horizontally misaligned beams 102.

Figure 2A:
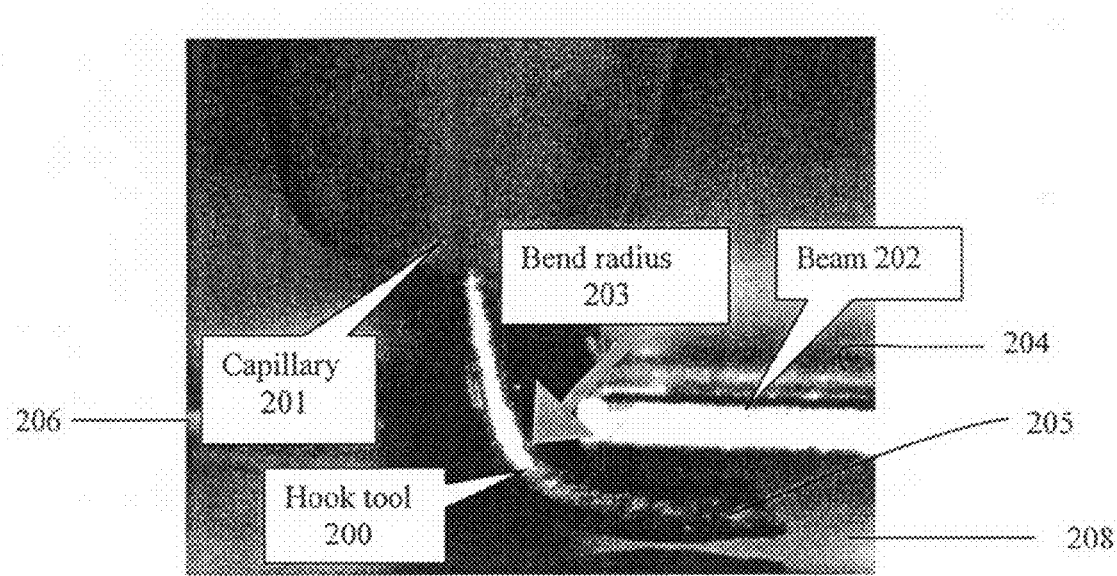
FIGS. 2A-2B illustrate a lift-up beam alignment process according to an embodiment of the invention.
Figure 2B:
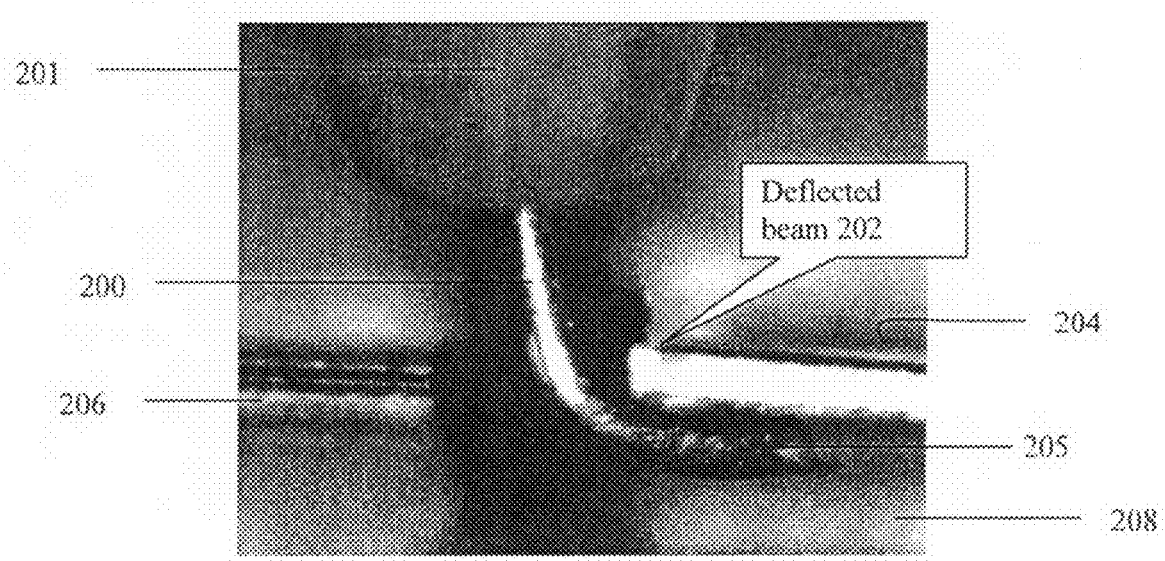

As illustrated in FIGS. 2A-2B, which depicts another embodiment of the invention, a lift-up vertical alignment process may be performed. In the illustrative lift-up (repair) process of the invention, probe beams 202 that have become vertically downwardly out of plane (for example, as determined relative to the calculated linear best-fit horizontal plane described herein, for example) on probe substrate 208 or the like, that is too close to the surface of probe substrate 208 or below the desired plane of contact/calculated linear best-fit plane, that is, too-low, are brought back into vertical alignment within the desired plane of contact/calculated linear best-fit horizontal plane as described herein. This lift-up process may be an automated process, for example.

For example, lift-up or hook tool 200 may be installed, directly or indirectly, into a machine such as a wire bonder (not shown) squared to the bonder's X-Y axis to ensure grounding of all beams 202, 204 to the work-holder base.

For example, it is determined which beams are below a desired height by touching down on the beam tips and the substrate surface (e.g., see FIGS. 4B-4C), which facilitates an initial planarity determination (and which beams which are out of a planarity specification). According to an embodiment of the invention, the horizontal beam adjustment (e.g., see FIGS. 1A-1F) if first completed, and then the linear best-fit horizontal plane is calculated (e.g., using the push-down tool 300), and then the actual beam heights are measured to establish the: (1) below horizontal plane beams 202 (see beam 202 in FIGS. 2A-2B), (2) in horizontal plane beams (e.g., beams 204, 404), and (3) above horizontal plane beams (see beam 402 in FIGS. 4A-4C). Of course, this order of operation is illustrative in nature, and the present invention is not limited hereto.

The following steps of the lift-up process may be performed in an automated, essentially preprogrammed process, for example.

This process using the lift-up or hook tool 200 may be blind, that is no post-process vertical measurements of the adjusted below-horizontal-plane-of-contact (linear best-fit horizontal plane)—misaligned beams 202 may be made. Thus, the hook tool process of FIGS. 2A-2B, for example, may be performed before the push-down tool process of FIGS. 4A-4B, for example, (see below). Further, the hook tool process may be programmed so as to intentionally raise below-horizontal-plane-of-contact-misaligned beams 202 so that they may all become above-horizontal-plane-of-contact/above-best-horizontal-fit-plane misaligned beams 402 (see the push-down tool process of FIGS. 4A-4B, for example) and thus may then be adjusted downwardly in the subsequent push-down tool process described below. It is also contemplated in yet another y embodiment of the invention that all probes on the substrate/probe card may include microbumps or the like between their respective beams and posts to intentionally make all the probes/beams above the horizontal-plane-of-contact/above the calculated-linear-best-fit-horizontal-plane. This may obviate this lift-up process but in turn may subject each/most all of the probes/beams to the push-down tool process described below.

As illustrated in FIG. 2A, for example, lift-up or hook tool 200, having bend radius 203 and tip 205, attached to standard ball bonding capillary 201 descends to a position in front of below-horizontal-plane-of-contact (linear best-fit horizontal plane)—misaligned beam 202 (such that the hook portion of lift-up tool 200 may be oriented towards the misaligned beam 202) until contact is made with the surface of probe card 208. Hook tool 200 then may move upwardly a predetermined clearance distance above the surface of probe substrate 208 (the Z-Clearance Parameter) and then may be positioned so at least its tip 205 is under misaligned beam 202. Hook tool 200 may have a bend radius 203 that may be, for example, from about 70 to 105 degrees, with a specific example being 90°.

Generally, all X-direction misaligned beams 202 may be processed (grouped together) and then all Y-direction misaligned beams 202 may be processed (grouped together), and visa versa.

Below-plane adjustment tool 200 is hook-shaped and may be formed from, for example, a piece of tungsten (W), WRe, Mo, tools steels, tungsten carbides, or titanium carbide wire having a diameter such that may be hook-shaped such that hook tool 200 may lift single beam 202 without interfering with adjacent beams 204. Hook tool bend radius 203 is such that tool 200 may fit between opposing beams 202, 206.

As illustrated in FIG. 2B, for example, hook tool 200 may be raised up a fixed distance, depending upon the properties of misaligned beam 202, such as its composition and the amount of misaligned beam's 202 misalignment, to deflect beam 202 a predetermined vertical distance above the calculated best-fit horizontal plane, so as to bring vertically misaligned beam 202 into alignment once hook tool 200 is removed.

Hook tool 200 may then retract from the now aligned beam by using a path reverse to that used to raise up beam 202.

Figure 4A:
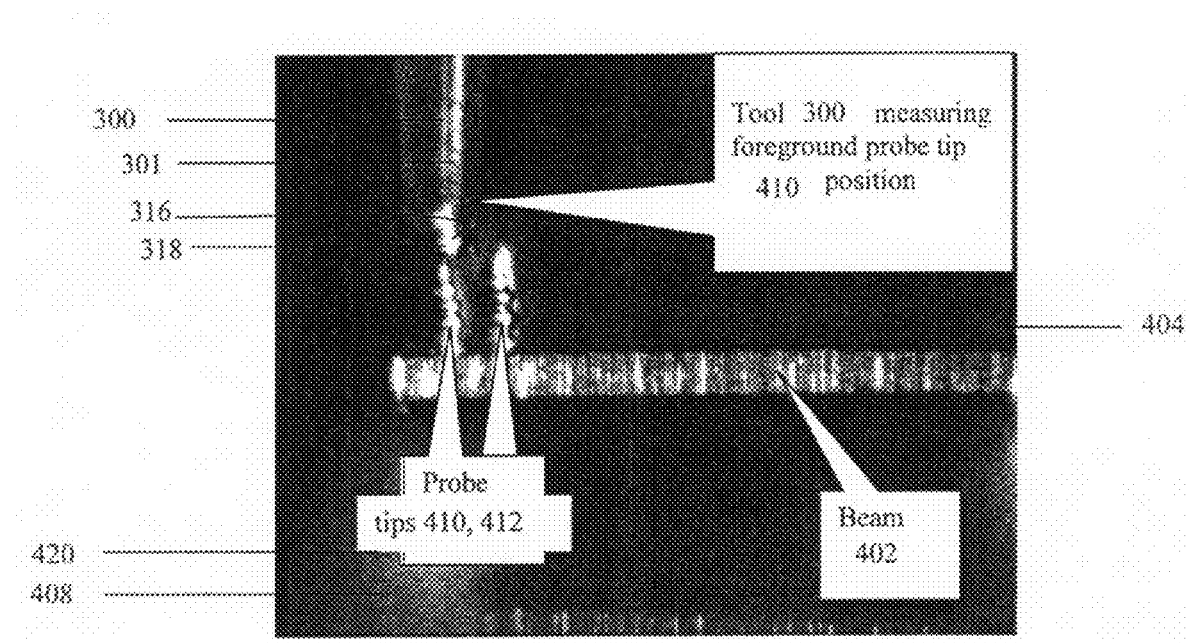
FIGS. 4A-4C illustrate a push-down beam alignment process according to an embodiment of the invention.
Figure 4B:
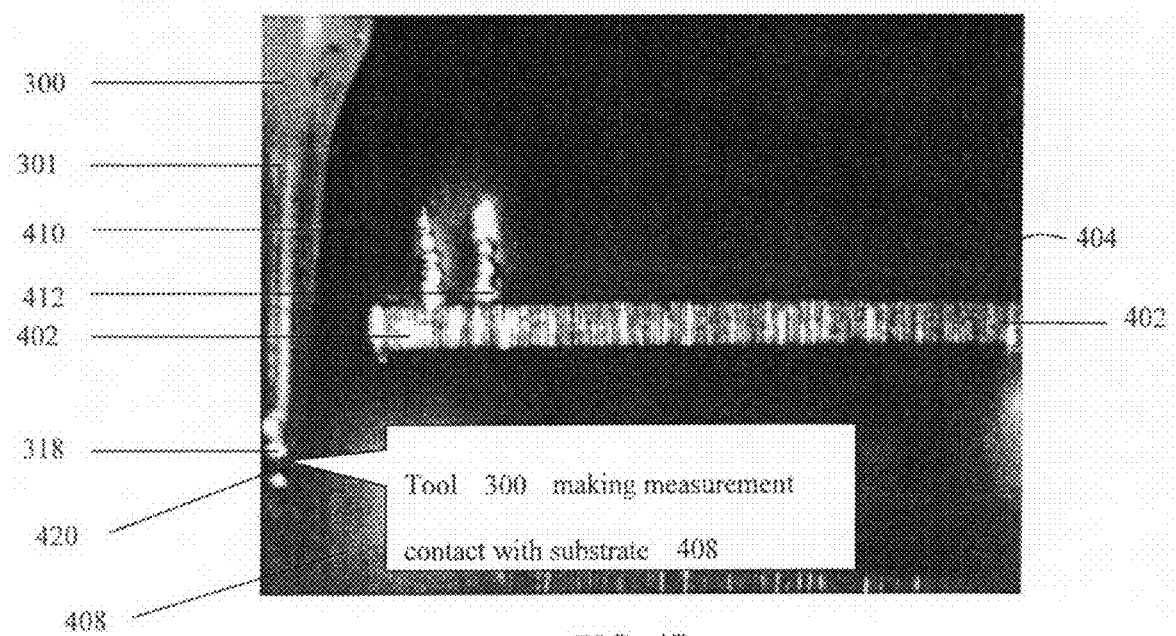

As illustrated in FIGS. 4A-4B, which depict another embodiment of the invention, a push-down (repair) process may be performed to vertically realign probe beams 402 that have become/are upwardly out of the horizontal plane (best-fit horizontal plane)/too far from the surface of probe substrate 408 of a probe card or the like, that is too-high, as described below. This push-down process may be an automated process, for example.

Figure 3A:
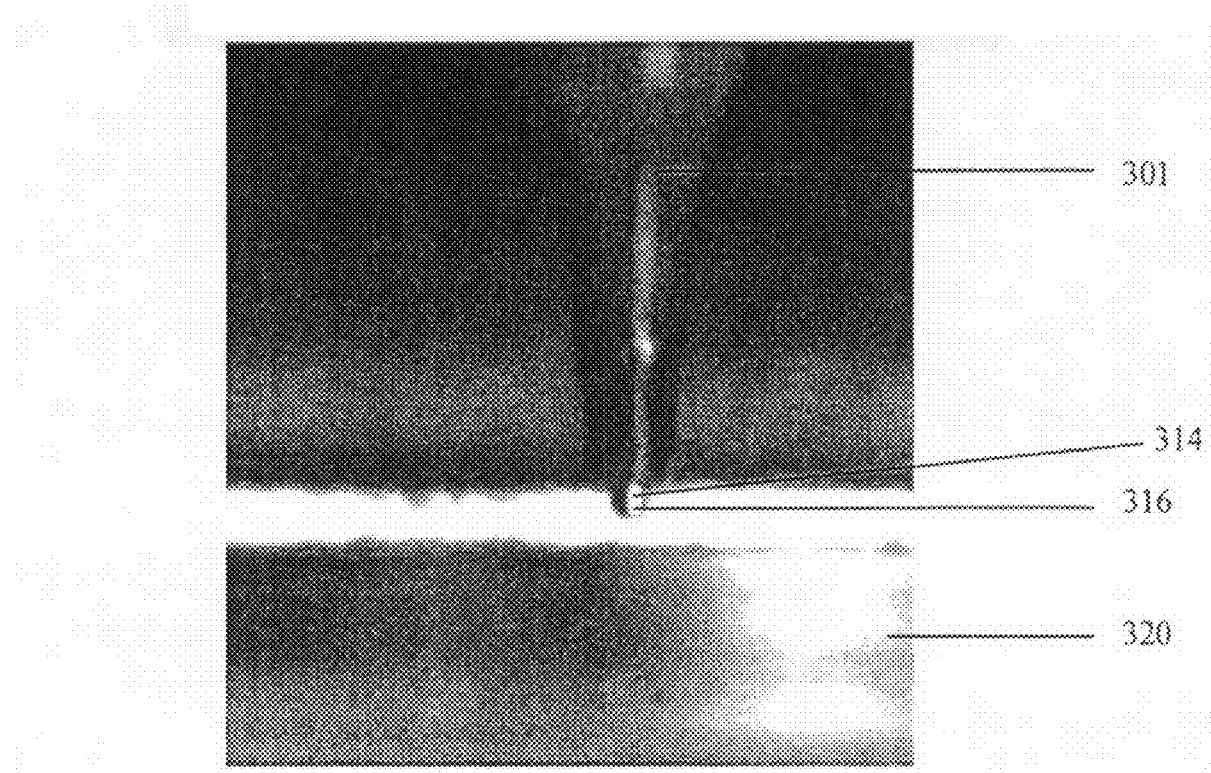
FIGS. 3A-3B illustrate formation of a push-down tool according to an embodiment of the invention.
Figure 3B:
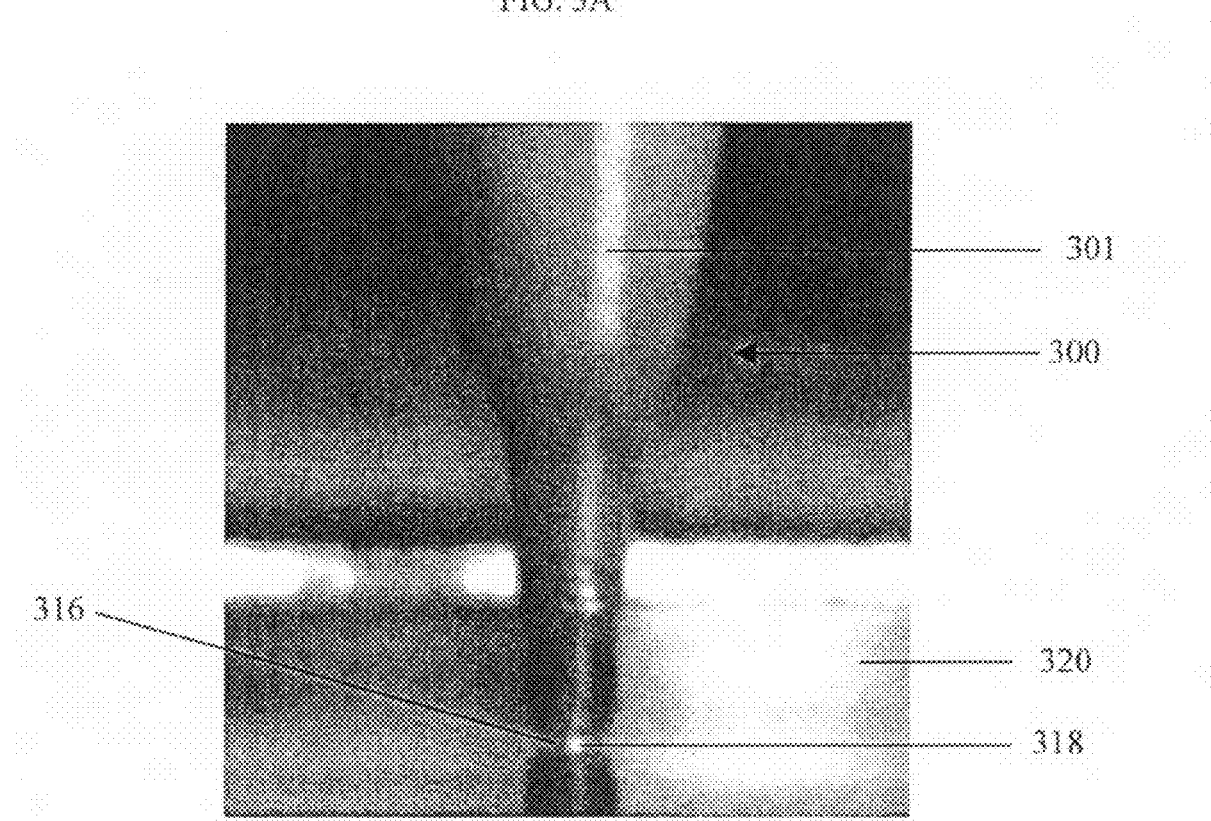

As illustrated in FIGS. 3A-3B, which depict an embodiment of the invention, an illustrative push-down (push or planarization) tool 300 may be provided.

As illustrated in FIG. 3A, for example, ball 316 may be formed at the exposed end of, for example, platinum iridium (PtIr) wire 314 that may extend through standard bonding capillary 301, for example, using an Electronic Flame Off system, for example, above surface 320 of a structure. Ball 316 may thus be seated into capillary 301. In other embodiments of the invention, platinum iridium (PtIr) wire 314 may be any electrically conductive wire, and need not be made out of platinum iridium (PtIr).

As illustrated in FIG. 3B, capillary 301/ball 316 may then be impacted onto surface 320 so as to permanently press ball 316 into the capillary hole and flatten seated ball 316 to form flattened end 318 of seated ball 316 and form push tool 300. Ball 316/flattened end 318 are electrically conductive and may be comprised of, for example, Pd alloys, Pt alloys, Cu alloys, or Au alloys.

Figures 3C, 3D:
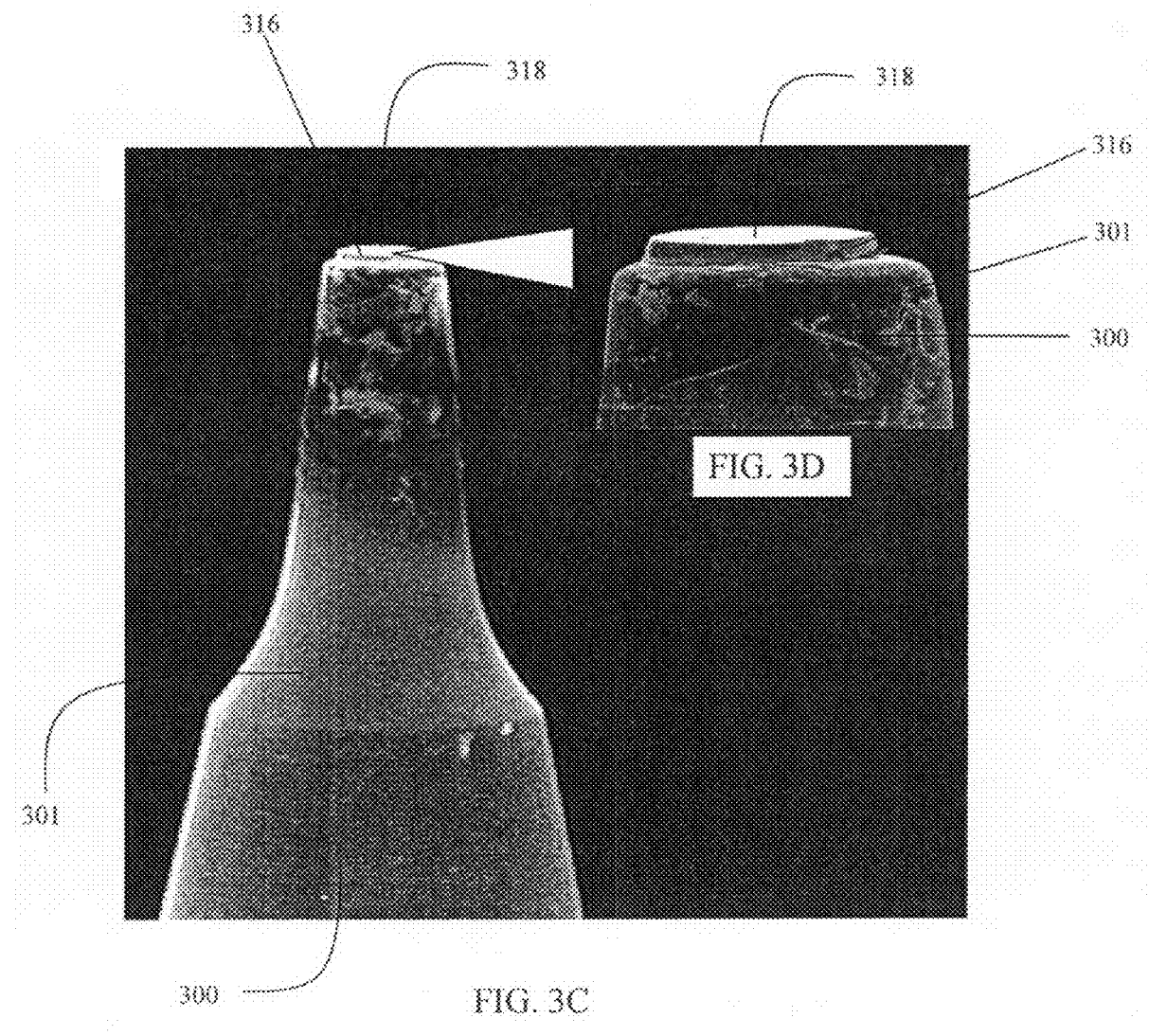
FIG. 3C is an illustration of a portion of a push-down tool according to an embodiment of the invention.
FIG. 3D is an enlarged portion of FIG. 3C according to an embodiment of the invention.

This is more clearly illustrated in FIG. 3C, for example, which is an inverted and enlarged view of flattened end 318 of seated ball 316 and the end of capillary 301 of push tool 300 of FIG. 3B apart from surface 320. FIG. 3D is an enlarged view of flattened end 318 and the end of capillary 301 of push tool 300 of FIG. 3C. Of course, other push tools (formed or provided through any alternative process) may be utilized.

The following steps of the push-down process may be performed in an automated, essentially preprogrammed process, for example.

Push/push-down/planarization, tool 300 may be used to contact probe substrate 408 (see FIGS. 4A-4C, for example) and record the height (Z) in various XY positions corresponding to the contact pads (not shown) or the like on probe substrate 408 which best represent the desired plane. This data may then used to calculate a linear best-fit (horizontal) plane defined by: (1) X-tilt; (2) Y-tilt; and (3) Z-Offset parameters. That is, with the intercept or "b" for the X-slope at zero (0), the X-tilt parameter is the X-slope, the Y-tilt parameter is the Y-slope and the Z-Offset parameter is the Y intercept (b). The linear best-fit horizontal plane may then used as the reference horizontal plane for the purpose of adjusting all probes to be parallel to/within this calculated plane.

A simple statistical analysis may also be used to identify any unusual Z datum/data markedly outside the statistical averages which may have skewed the linear best-fit plane calculation. One may then choose to eliminate any such unusual datum/data from the data pool if it/they are suspected to be either a bad measurement or a blemish on the (ceramic) substrate 408 so as to not unduly/improperly influence the linear best-fit horizontal plane (calculation).

Figure 4C:
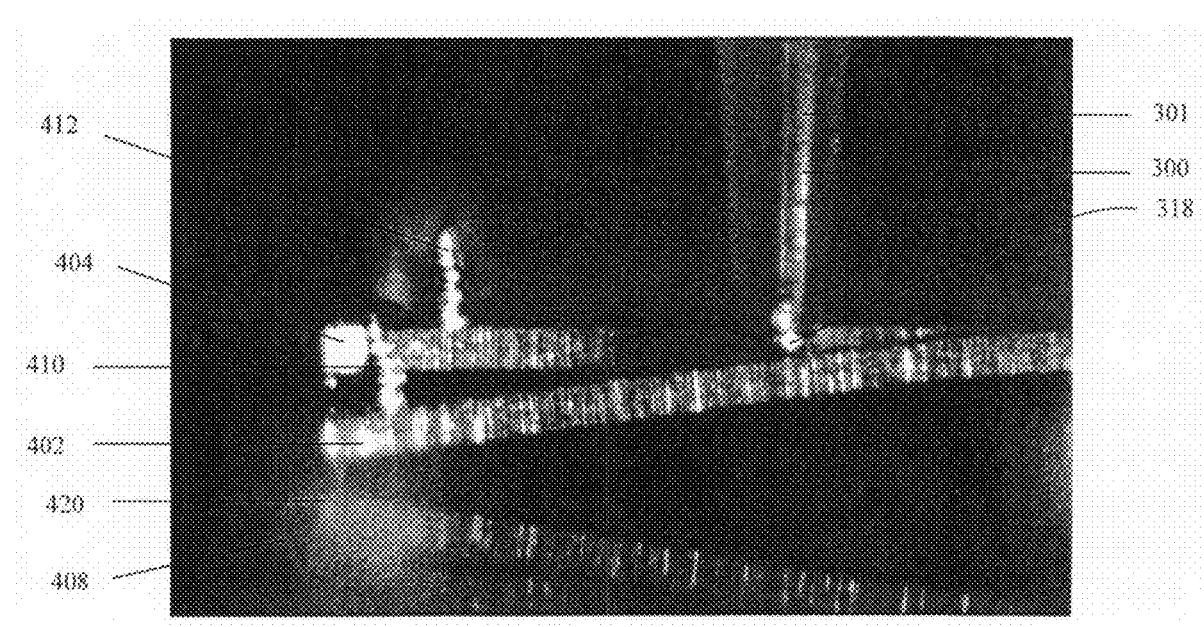

Once this linear best-fit plane has been calculated, the lift-up alignment (repair) process of FIGS. 2A-2B and the push-down alignment (repair) process illustrated in FIGS. 4A-4C may be performed.

As illustrated in FIGS. 4A to 4C, which depict an embodiment of the invention, a push-down vertical alignment process may be performed. In the illustrative push-down (repair) process of the present invention, probe beams 402 that have become vertically upwardly out of plane (too-high) (for example, as determined relative to the calculated linear best-fit plane described above) on probe substrate 408 or the like, that are too far from surface 420 of probe substrate 408 (or above the desired plane of contact/calculated linear best-fit horizontal plane) may be brought back into vertical alignment within the desired plane of contact/calculated linear best-fit horizontal plane.

For example, all X-direction misaligned beams 402 may be processed first (grouped together) and then all Y-direction misaligned beams 402 may be processed next (grouped together), and visa versa.

As illustrated in FIG. 4A, for example, planarization or push-down tool 300 (with bonding capillary 301) may descend to a position over probe tip 410 of (the foreground) too-high beam 402 until electrical contact (or physical contact) is made between flattened seated ball end 318 (of seated ball 316) and the upper surface of probe tip 410. Immediately upon this electrical detection of the top of probe tip 410, the height of push-down tool 300, and hence the height of the tip of probe tip 410 may be recorded. It is noted that the use of a mechanical/servo contact detection apparatus/system may deflect unsupported beam 402, potentially damaging beam 402 and also rendering an inaccurate measurement. An electrical detection method employed according to the present invention may provide not only a more accurate height datum/data, but also may not appreciably deflect unsupported beam 402. Adjacent, background beam 404 with probe tip 412 are not contacted by the push-down tool 300.

As illustrated in FIG. 4B, push-down tool 300 may then be moved up, and away from, foreground beam 402 and then down to electrically contact (as determined by servo feedback) flattened end 318 to surface 420 of probe card/substrate 408 at a pre-selected XY location of substrate 408. Immediately upon this electrical detection of surface 420 of substrate 408, the height of substrate surface 420 may be recorded.

Using these two measured heights, the Actual Height of the probe tip 410 above substrate/probe card surface 420 is determined and compared to, for example, the calculated linear best-fit plane, where the substrate 408 height may be used as a reference point to determine deflection of the substrate.

As illustrated in FIG. 4C, for example, planarization/push-down tool 300 may then be positioned over (foreground) beam 402 a programmed distance from probe tip/bump 410 based upon the characteristics of beam 402 such as composition. Push-down tool 300 may then descend downwardly in the Z-direction until contact (e.g., electrical contact) between flattened end 318 and beam 402 is detected. Push-down tool 300 then further descends downwardly in the Z-direction a calculated distance (depending upon the characteristics of beam 402), deflecting beam 402 downwardly. Then push-down tool 300 may raise upwardly in the Z-direction to clear beam 402 such that upon liftoff of push-down 300 tool from beam 402, the upper surface of probe tip 410 will be at the desired height above surface 420 of substrate/probe card 408.

Push-down tool 300 may then retract from the now aligned beam by using a path reverse to that used to push down beam 402.

According to an embodiment of the invention, the vertical distance above the probe substrate surface is remeasured for each of the above-the-plane beams after they have been pushed down with the push down tool. If certain of the beams are determined to be too high still, the may be pushed down repeatedly, as desired.

One may also effectuate repairs of probe cards in accordance with the teachings of the present invention that have probes that have come out of vertical or horizontal alignment using horizontal alignment tool 100/process, lift-up alignment tool 200/process and/or push-down alignment tool 300/process, or with probe cards that have had probes/beams replaced to ensure their proper alignment.

According to certain embodiments of the invention, X-Y-Z data (and the calculated linear best fit plane data) may be stored for a given probe card such that it may be utilized in a later alignment or repair. Of course, contemporaneous measurements may also be made for such subsequent alignment and repair.

The advantages of one or more embodiments of the invention may include, inter alia, for example: (1) providing a robust probe planarization and alignment method for probes bonded on a substrate or bonded on a substrate by a MEMs-like process; (2) providing an automated probe planarization and alignment method for probes bonded on a substrate or bonded on a substrate by a MEMs-like process; and (3) providing an automated probe planarization and alignment method for probes using a machine such as a conventional wire bonder.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A method for performing automated alignment of a probe of a probe card, comprising:
   determining desired horizontal locations for probes of said probe card for a device under test (DUT) to be tested by said probe card;
   determining actual horizontal positions for the probes of said probe card;
   comparing the desired horizontal location for a probe with the actual horizontal position for the probe to determine a horizontal correction distance and a horizontal correction direction to correct a horizontal alignment for the probe;
   upon obtaining said horizontal correction distance and said horizontal correction direction for said probe, a first tool automatically correcting the horizontal alignment for said probe with respect to the probe card based on said horizontal correction distance and said horizontal correction direction;
   upon determining that an actual vertical position of said probe is closer to said probe card than a desired vertical position, a second tool automatically changing the actual vertical position of said probe with respect to the probe card to the desired vertical position; and
   upon determining that said actual vertical position is farther from said probe card than said desired vertical position, a third tool automatically changing the actual vertical position of said probe with respect to the probe card to the desired vertical position.

2. The method of claim 1, wherein the actual horizontal position of said probe is determined using a wire bonder machine Pattern Recognition System (PRS).

3. The method of claim 1, wherein the actual horizontal position of said probe is determined by measuring the position of a tip of said probe.

4. The method of claim 1, wherein the desired horizontal locations for the probes are determined by consulting design data for a device under test (DUT) to generate a reference system that defines the desired horizontal locations for the probes, of the probe card, relative to each other.

5. The method of claim 1, wherein said horizontal correction distance is determined based upon the elasticity of said probe.

6. The method of claim 1, wherein said horizontal correction distance is determined based upon a characteristic of said probe.

7. The method of claim 1, wherein determining said actual vertical position of said probe comprises:
   calculating a best-fit horizontal plane for probes of said probe card; and
   determining said actual position, of said probe, relative to said best-fit horizontal plane.

8. The method of claim 1, wherein the second tool automatically changing the actual vertical position of said probe with respect to the probe card includes:
   lifting said probe to an intermediate location based upon the elasticity of said probe, wherein said intermediate location is farther away from said probe card than said desired vertical location.

9. The method of claim 1, wherein the third tool automatically changing the actual vertical position of said probe with respect to the probe card includes:
   pushing said probe to a location based upon the elasticity of said probe, wherein said location is closer to said probe card than said desired vertical location.

10. The method of claim 1, wherein the horizontal alignment is corrected for any probes of said probe card which need their horizontal alignment corrected prior to any probes having their actual vertical position adjusted.

11. The method of claim 1, wherein the first tool automatically correcting the horizontal alignment for said probe with respect to the probe card includes verifying that the horizontal alignment has been corrected using a Pattern Recognition System (PRS) of a wire bonder machine.

* * * * *